(12) United States Patent
Tobisaka et al.

(10) Patent No.: US 7,405,913 B2
(45) Date of Patent: Jul. 29, 2008

(54) SEMICONDUCTOR DEVICE HAVING TRANSISTOR WITH HIGH ELECTRO-STATIC DISCHARGE CAPABILITY AND HIGH NOISE CAPABILITY

(75) Inventors: Hiroshi Tobisaka, Nagano (JP); Tatsuhiko Fujihira, Nagano (JP); Shin Kiuchi, Nagano (JP); Yoshiaki Minoya, Nagano (JP); Takeshi Ichimura, Nagano (JP); Naoki Yaezawa, Nagano (JP); Ryu Saitou, Nagano (JP); Shouichi Furuhata, Nagano (JP); Yuichi Harada, Nagano (JP)

(73) Assignee: Fuji Electric Device Technology Co., Tokyo (JP)

( * ) Notice: Subject to any disclaimer, the term of this patent is extended or adjusted under 35 U.S.C. 154(b) by 598 days.

(21) Appl. No.: 10/800,013

(22) Filed: Mar. 15, 2004

(65) Prior Publication Data

US 2004/0238893 A1 Dec. 2, 2004

(30) Foreign Application Priority Data

Apr. 11, 2003 (JP) ............................. 2003-107830

(51) Int. Cl.
 *H02H 9/00* (2006.01)
 *H02H 3/22* (2006.01)
(52) U.S. Cl. ...................................... 361/56; 361/111

(58) Field of Classification Search ................... 361/56, 361/111
See application file for complete search history.

(56) References Cited

U.S. PATENT DOCUMENTS

| 4,267,557 A | * | 5/1981 | Muramoto et al. | 257/577 |
| 4,293,868 A | * | 10/1981 | Iizuka et al. | 257/577 |
| 6,365,932 B1 | * | 4/2002 | Kouno et al. | 257/341 |
| 6,469,353 B1 | * | 10/2002 | Amerasekera et al. | 257/356 |
| 6,977,425 B2 | * | 12/2005 | Yoshida et al. | 257/517 |

FOREIGN PATENT DOCUMENTS

JP 3-49257 3/1991

* cited by examiner

*Primary Examiner*—Ronald W Leja
(74) *Attorney, Agent, or Firm*—Rabin & Berdo, P.C.

(57) ABSTRACT

A semiconductor device in includes a transistor and a surge absorption element such as Zener diode, that are formed on the same substrate and connected in parallel. The surge absorption element has a resistance during breakdown operation that is smaller than the resistance of the surge absorption element during breakdown operation of the transistor. In addition, the secondary breakdown current of the surge absorption element is larger than the secondary breakdown current of the transistor. Upon application of a high ESD voltage and high surge voltage, the energy of the ESD and surge is absorbed by operation of the surge absorption element and is limited to a voltage equal to or less than the breakdown voltage of the transistor, which would otherwise be destroyed.

12 Claims, 2 Drawing Sheets

US 7,405,913 B2

SEMICONDUCTOR DEVICE HAVING TRANSISTOR WITH HIGH ELECTRO-STATIC DISCHARGE CAPABILITY AND HIGH NOISE CAPABILITY

BACKGROUND OF THE INVENTION

1. Field of the Invention

The invention relates to a semiconductor device that comprises a transistor with high ESD (Electro Static Discharge) capability and high noise capability including EMC (Electro Magnetic Compatibility).

2. Related Art

Conventionally, integrated intelligent switch devices, which are the result of integrating a plurality of power semiconductor elements (switch elements) and a drive control circuit and so forth on the same chip, are used in automobile electrical components, a variety of industrial machinery, motor control, OA (Office Automation) devices, mobile (portable) devices or domestic electrification devices, and so forth, which require high ESD capability and high noise capability including EMC.

Integrated intelligent switch devices are such that a surge absorption element is formed on the same semiconductor substrate in order to protect each element in the device from surge voltages, noise, and so forth. See Japanese Patent Application Laid-Open No. H3-49257 (third figure, for example).

FIG. 3 is a cross-sectional view of a constitution in which a lateral MOSFET and a vertical-type diode, which is a surge absorption element, are formed on the same semiconductor substrate. As shown in FIG. 3, a lateral power MOSFET 20 and a vertical-type diode 30, which is a surge absorption element, are formed on a semiconductor substrate 10.

The semiconductor substrate 10 consists of a low concentration N layer 12 on a high concentration N layer 11. P-wells 21 and 31 are formed in the surface region of the low concentration N-layer 12. The lateral MOSFET 20 is formed in the P-well 21. The vertical-type diode 30 is formed in the P well 31.

The surface of the P-well 31 is connected to an anode electrode 33 via the high concentration P layer 32. The anode electrode 33 is connected by wiring 35 to the source electrode 27 of the lateral MOSFET 20, which is connected to the surface of the P-well 21 via a high concentration N layer 24. The lateral MOSFET 20 has a gate electrode 26 and a drain electrode 25.

An electrode 13 is formed on the rear surface of the semiconductor substrate 10. The electrode 13 serves as a cathode electrode of the diode 30. The electrode 13 is connected to the drain electrode 25 of lateral MOSFET 20 by wiring 26 In the constitution of FIG. 3, when an ESD or surge, or the like, is applied to the drain electrode of the lateral MOSFET 20, the energy of the ESD or surge is absorbed by the vertical-type diode 30 to protect the lateral MOSFET 20.

However, when the above device is used in an automobile application in which there are strict demands with regard to ESD capability and surge/noise capability, an extremely high ESD capability of 10 kv to 15 kv (test conditions 150 p F, 150Ω) is required, and, more particularly in a power semiconductor element, a high ESD capability with a typical ESD capability of 25 kv or more is required.

When the above requirements are not satisfied by a power IC equipped with a MOSFET or the like, there is a need to adapt elements such as condensers, diodes, resistors, and so forth as external discrete devices. Thus, there are problems such as an increase in the number of parts, an increased number of operating steps for assembly or the like, and increased costs. On the other hand, by adopting the constitution shown in FIG. 3, external parts can be eliminated.

However, in order to satisfy the desired surge absorption capacity, the surge absorption element that satisfies the above requirements is formed to afford this capacity scope. Thus, the chip area is larger. The increase in the surface area of the surge absorption element in integrating a plurality of elements in one chip, raising the withstand voltage, and reducing the chip area through increased intricacy is a major problem in efforts to reduce the chip-area and costs.

OBJECT AND SUMMARY OF THE INVENTION

The invention was conceived in view of the above problems. Thus an object of the invention is to provide a semiconductor device that does not require a surplus surge-absorption capacity and comprises a lateral MOSFET that has the required high ESD capability and high surge capability with a smaller chip area.

In order to achieve the above object, the inventors undertook intensive research, the details of which will now be described. The inventors conducted an experiment to determine the ESD capability with respect to the surface area of the element region of a 60V-rated lateral MOSFET 20, a vertical-type MOSFET 20' and a vertical-type Zener diode 30.

The results are shown in graphical form in FIG. 4. In the figure, the line marked with spaced triangles corresponds to the vertical-type Zener diode 30. The line marked with spaced circles corresponds to the 60V-rated vertical-type MOSFET 20'. The line marked with spaced solid boxes corresponds to the 60V-rated lateral MOSFET 20. The line marked with spaced open boxes corresponds to the 60V-rated horizontal type MOSFET having a 60V-rated horizontal type Zener diode. The substrate, process conditions and element breakdown voltage are the same. Further, as the ESD-capability measurement conditions, implementation involved using the condition 150 pF-150Ω, which is mainly used in automobile applications in Japan. The ESD capability required in automobile applications is 10 kV to 15 kV or more. More particularly, the typical ESD capability required by the MOSFETs 20 and 20' is 25 kV or more.

Conventionally, a power IC, which comprises the MOSFETs 20 and 20' above, or the like, is put to practical use by adding a protective condenser, diode and resistor, and so forth, as external discrete parts when the above requirements are not satisfied. Alternatively, there is the disadvantage of an increase in costs. As can be seen from FIG. 4, in order to satisfy the above-mentioned ESD capability requirement by using the MOSFETs 20 and 20', the element active area must be sufficiently large. More particularly, the lateral MOSFET 20 requires a large active area in excess of 10 mm$^2$ in order to achieve an ESD capability of 10 kV. On the other hand, the vertical-type Zener diode 30 is able to achieve an ESD capability of 30 kV by means of a small element active area of 0.2 mm$^2$, which is at the level of a pad electrode.

An increasing intricacy of the lateral MOSFET 20 leads to a drop in the ON-state resistance per unit area, which develops as far as 1 mΩ cm$^2$ for a 60V rating. At present, in an ON-state resistance region of several hundred mΩ, which is the most common case in an automobile application, the element surface area of the lateral MOSFET 20 is sufficient at about several mm$^2$. From this point on, the surface area of elements mounted in a power IC will become increasingly small, and hence there will be a tendency for the ESD capability to drop. Here, the present inventors rated the relationship of the ESD capability with the element surface area of the lateral MOSFET 20, vertical-type MOSFET 20', and vertical-type Zener diode 30 by means of the same scale as data. Accordingly, the problem with the ESD capability tendency can be dealt with quantitatively with respect to the lateral MOSFET 20, vertical-type MOSFET 20', and vertical-type Zener diode 30.

Based on the facts above, in the case of the invention, in a semiconductor device comprising a transistor and diode that are formed on the same substrate and connected in parallel, the resistance during the breakdown operation of the diode may be rendered smaller than the resistance during the breakdown operation of the transistor and the secondary breakdown current of the diode may be rendered larger than the secondary breakdown current of the transistor.

Further, in the case of the above constitution, the breakdown voltage of the diode may be rendered smaller than the breakdown voltage of the transistor, the secondary breakdown voltage of the diode may be rendered smaller than the secondary breakdown voltage of the transistor, or the secondary breakdown current of the diode may be rendered larger than the surge current flowing to the diode.

In each of the above constitutions, the transistor is suitably constituted by a lateral MOSFET and the diode by a vertical-type Zener diode.

Further, in a case where an integrated intelligent switch device is constituted by a plurality of transistors, a diode may be provided in at least one location between the input terminal and voltage source terminal of this device, the output terminal and voltage source terminal, or the voltage source terminal and ground, and at least one of the above relationships is satisfied by the diode and transistor.

In order that the diode and transistor satisfy the relationships above, the resistivity of the semiconductor substrate may be set at 0.3 to 10 Ωcm. Further, and more particularly, a semiconductor layer may be provided on the rear surface of the semiconductor substrate, and the resistivity of the rear-surface semiconductor layer may be set at 0.1 Ωcm or less, for example.

Furthermore, the junction depth and impurity concentration of the well forming the diode are determined by the conditions for producing punch-through or reach-through between the diode and the semiconductor layer at the semiconductor-substrate rear surface. In order to establish the breakdown voltage of the diode at the desired value, the relationship between the junction depth and impurity concentration of the well forming the diode, and the resistivity and thickness of the semiconductor substrate are established.

DETAILED DESCRIPTION OF THE PREFERRED EMBODIMENT

The semiconductor device according to the preferred embodiment of the invention is constituted such that the lateral MOSFET and Zener diode constituting the vertical-type surge absorption element are formed on the same semiconductor substrate without the formation of a special element separation structure. Moreover, the drain electrode or source electrode of the lateral MOSFET, and the surface electrode of the vertical-type Zener diode are electrically connected by metal electrode wiring.

Figure 1:
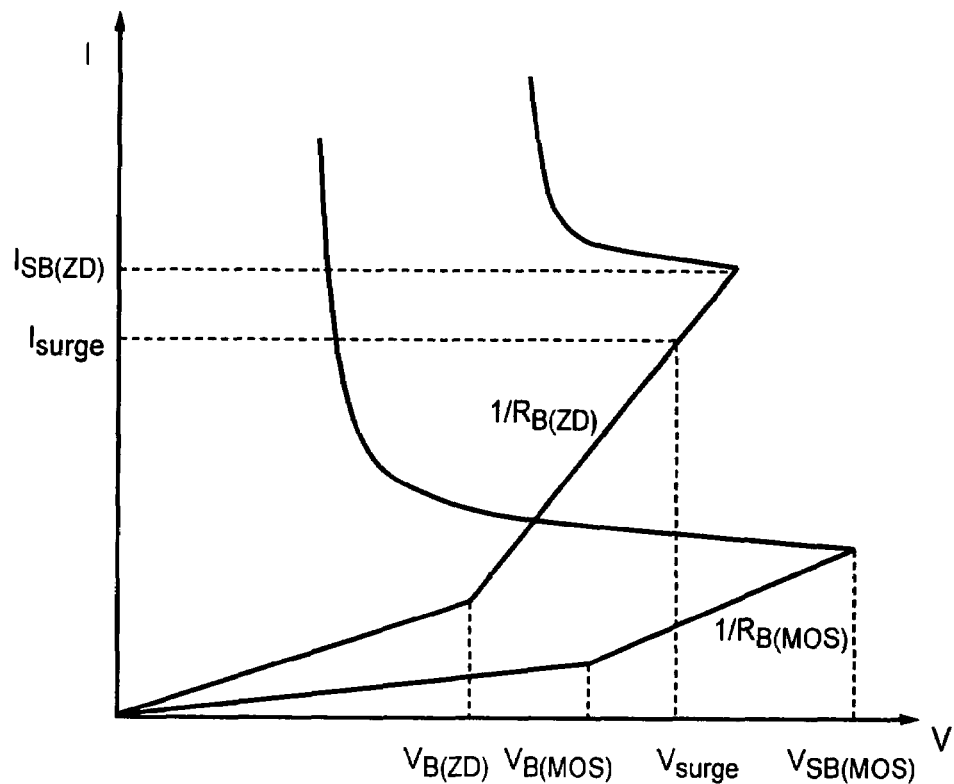
FIG. 1 shows the I-V characteristic of the lateral MOSFET and the Zener diode.

FIG. 1 shows the I-V characteristic of the lateral MOSFET 20, which is a transistor, and the Zener diode 30, which is a surge absorption element. First, the resistance ($R_{B(MOS)}$) during the breakdown operation of the lateral MOSFET 20 declines during the breakdown operation and satisfies the relation of Equation (1) with the resistance ($R_{B(ZD)}$) during the breakdown operation of the vertical-type Zener diode 30:

$$(R_{B(ZD)}) < (R_{B(MOS)}) \tag{1}$$

and, at the same time, the relation of Equation (2) between the secondary breakdown current ($I_{SB(MOS)}$) of the lateral MOSFET 20 and the secondary breakdown current ($I_{SB(ZD)}$) of the vertical-type Zener diode 30 is satisfied (Condition 1).

$$(I_{SB(ZD)}) > (I_{SB(MOS)}) \tag{2}$$

The lateral MOSFET can be protected from surges by satisfying both Equation (1) and Equation (2) above, at the same time.

In addition to Equations (1) and (2) above, the relation of Equation (3) between the breakdown voltage of the lateral MOSFET 20 ($V_{B(MOS)}$) and the breakdown voltage of the vertical-type Zener diode ($V_{B(ZD)}$) is satisfied (Equation 2).

$$(V_{B(ZD)}) < (V_{B(MOS)}) \tag{3}$$

The lateral MOSFET can be protected from surges by satisfying Equations (1) to (3) at the same time. Alternatively, in addition to the relations of Equations (1) and (2) above, the relation of Equation (4) between the secondary breakdown voltage of the lateral MOSFET 20 ($V_{SB(MOS)}$) and the secondary breakdown voltage of the vertical-type Zener diode ($V_{SB(ZD)}$) is satisfied (Equation 3).

$$(V_{SB(ZD)}) < (V_{SB(MOS)}) \tag{4}$$

The lateral MOSFET can be protected from surges by satisfying Equations (1), (2), and (4) at the same time. Further, Equations (1) to (4) are satisfied at the same time (Equation 4). The lateral MOSFET can thus be protected from surges.

Furthermore, in addition to the relations of Equations (1) and (2) above, the relation of Equation (5) between the surge current ($I_{surge}$) flowing to the vertical-type Zener diode 30 at the desired ESD and surge/noise capability and the secondary breakdown current of the vertical-type Zener diode 30 ($I_{SB(ZD)}$) is satisfied (Equation 5).

$$(I_{surge}) < (I_{SB(ZD)}) \tag{5}$$

Destruction of the vertical-type Zener diode caused by surges can be avoided, and the lateral MOSFET can be protected from surges by satisfying Equations (1), (2), and (5) above at the same time. Here, the surge current ($I_{surge}$) is a current that flows when a surge voltage of 25 kv is assumed for the test conditions 150 pF, and 150Ω, for example, and a 100 A current flows momentarily in the path F shown in FIG. 2 (described later). The measurement conditions are optionally set according to the element specifications and the surge voltage is optionally set in accordance with the element characteristics.

In order that the vertical-type Zener diode 30 and lateral MOSFET 20 satisfy the above relations, the resistivity of the semiconductor substrate where these two elements are formed may be set at 0.3 to 10 Ωcm. Further, more particularly, the semiconductor layer may be provided on the rear surface of the semiconductor substrate and the resistivity of this rear-surface semiconductor layer may be set at or below 0.1 Ωcm, for example.

Figure 3:
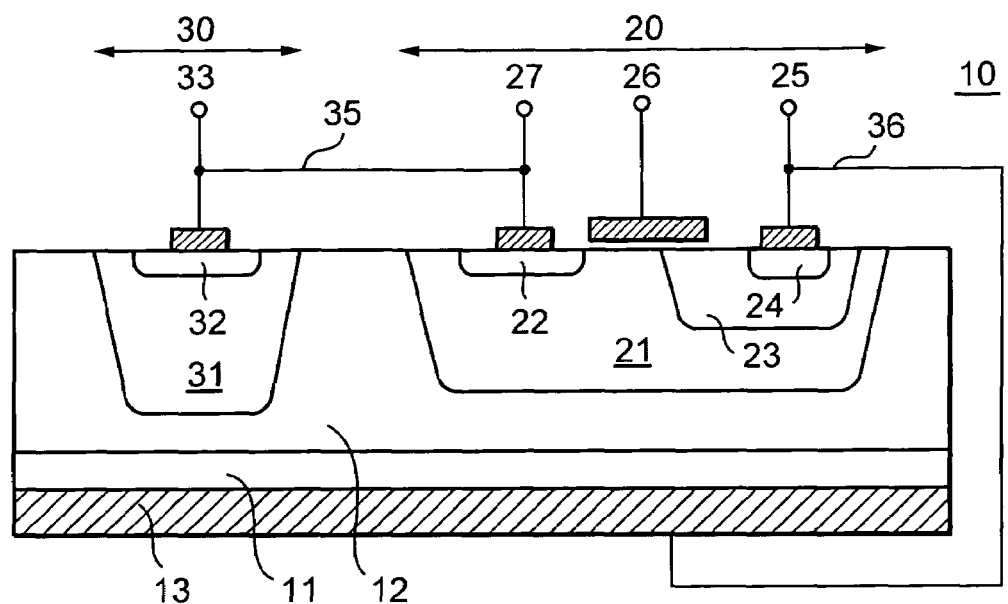
FIG. 3 is a cross-sectional view of the constitution of a conventional integrated intelligent switch device.
Figure 4:
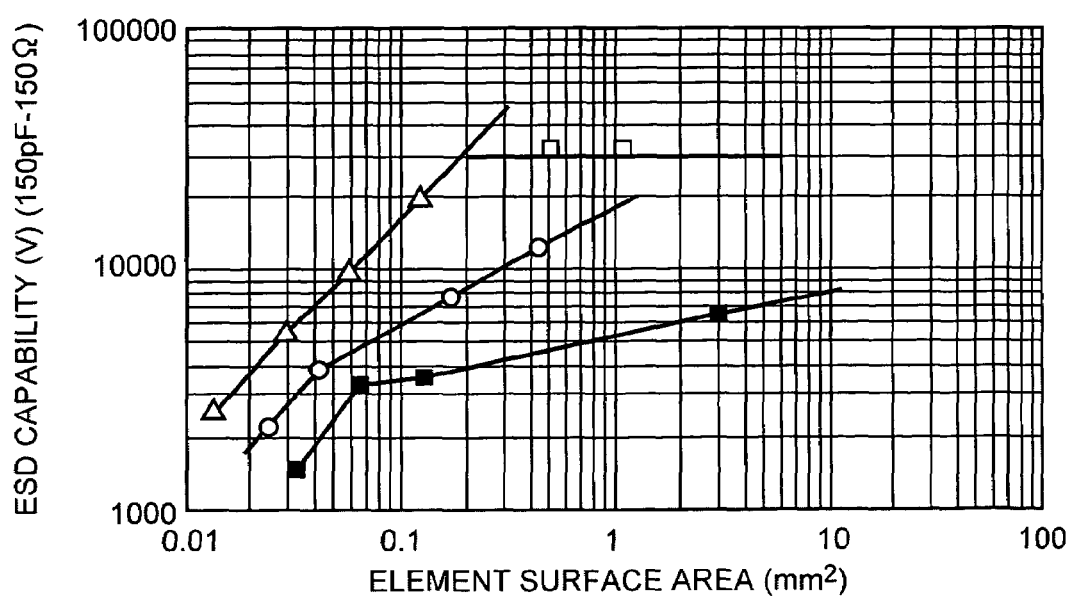
FIG. 4 is a characteristic diagram showing the results of an experiment on ESD capability with respect to element surface area for a 60V-rated lateral MOSFET, a vertical-type MOSFET, a vertical-type Zener diode, and a lateral MOSFET with high ESD capability.

In addition, in order to establish the breakdown voltage of the vertical-type Zener diode ($V_{B(ZD)}$) at the desired value, the production of punch-through or reach-through between the well region where the vertical-type Zener diode 30 is formed and the semiconductor layer of the semiconductor-substrate rear surface may be established as a condition. Also, the junction depth and impurity concentration of the well layer may be determined along with the resistivity and thickness of the semiconductor substrate. For example, in the case of the constitution of FIG. 3, the P well 31 is formed through ion implantation at $2.7 \times 10^{14}$ cm$^{-2}$ of impurities on a 0.95-Ωcm low concentration N layer 12.

Further, the conditions defined by Equations 1-5 above are preferably all satisfied. However, the protection of the MOSFET is feasible by satisfying at least one of these conditions. Therefore, when the concentration, layout, and so forth, of each region are designed to obtain the characteristics required by each element constituting the integrated intelligent switch device, easily adopted conditions may be selected from among the conditions 1 to 5 without sacrificing the characteristics of each element.

Figure 2:
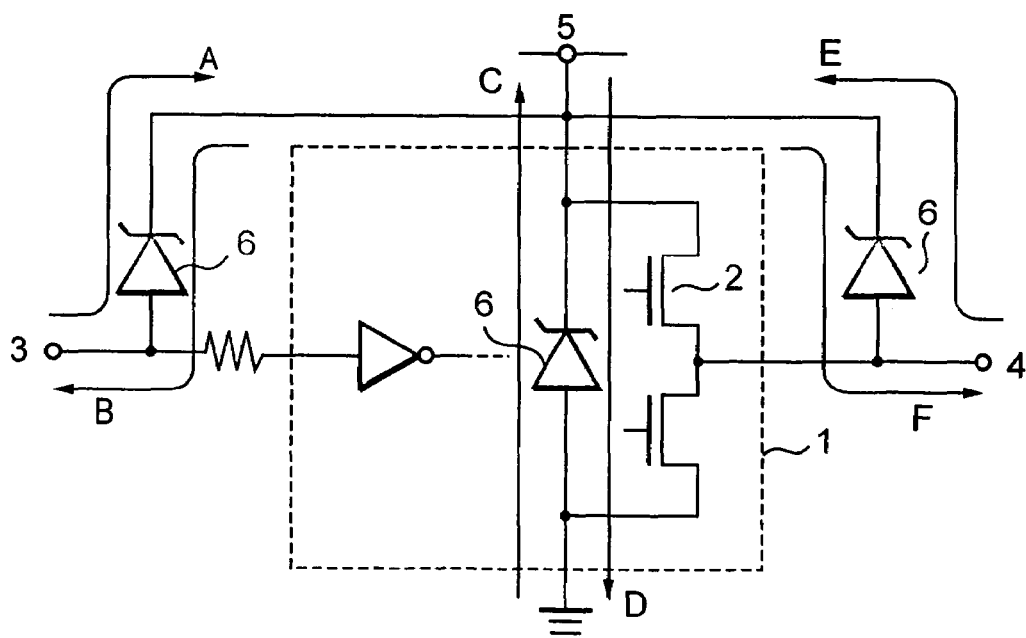
FIG. 2 is a cross-sectional view of the constitution of an example of the invention.

An example will be described next with reference to FIG. 2. FIG. 2 shows an example of the invention in an IC 1 is constituted by a plurality of MOSFETs 2, and comprises an input terminal 3, an output terminal 4, and a voltage source terminal 5.

When a surge voltage is applied to the IC 1, a surge current flows via the paths denoted by the arrows A to F. In order to protect the IC 1, that is, the MOSFETs 2 thereof, from this surge voltage, Zener diodes 6 is provided respectively between the input terminal 3 and the voltage source terminal 5, between the output terminal 4 and the voltage source terminal 5, and between the voltage source terminal 5 and ground. Here, at least one of the above-mentioned Condition 1 to 5 between the Zener diode 6 and MOSFET 2 is satisfied.

When such a condition is satisfied, the operation waveform for the Zener diode 6 and MOSFET 2 is then the I-V characteristic shown in FIG. 1. Upon application of an ESD surge or other surge, the voltage $V_{surge}$ is applied to the Zener diode 6 and MOSFET 2, and the current $I_{surge}$ flows to the Zener diode 6. Here, if the above-mentioned conditions are satisfied, the MOSFET 2 can be reliably protected from destruction caused by an ESD surge or other surge without the surge voltage $V_{surge}$ applied to the MOSFET 2 rising above the secondary breakdown voltage $V_{SB(MOS)}$ of the MOSFET 2. As a result of this constitution, the size of the surge absorption element can be optimized and the chip size of the integrated intelligent switch device can be reduced.

Further, although a Zener diode is placed in each path in FIG. 2, when the mode in which the surge voltage is applied can be specified, a surge absorption element may be placed between at least the terminals of the Zener diode, and placement in other locations can be omitted. Further miniaturization of the chip size can be attempted by dispensing with placement of surge absorption elements.

In the embodiment and example above, a description was provided by way of an example of a lateral MOSFET and a vertical-type Zener diode constituting a surge absorption element. However, the invention is not so limited, it being possible to adopt elements that satisfy conditions 1 to 5 above.

With the invention, it is possible to obtain a semiconductor device that possesses high ESD capability and high surge capability with an adequately small surface area, normally without affecting the MOSFET operation in any way or compromising the ESD or surge absorption capacity, and so forth. Hence, it is possible to implement a lower-cost integrated power IC and integrated communication IC, and so forth, that suppresses the drop in the ESD capability and surge/noise capability that accompanies the intricate integration of semiconductor devices, does not provoke a marked increase in the chip area, uses a lower-cost semiconductor substrate, and possesses high ESD capability and high surge/noise capability.

This application corresponds to applicants' Japanese Patent Application Ser. No. 03-107830, filed Apr. 11, 2003, the entire disclosure of which is incorporated herein by reference.

What is claimed is:

1. A semiconductor device, comprising:
   a semiconductor layer having a first conductivity type;
   a transistor formed in a transistor well in the semiconductor layer, the transistor well having a second conductivity type; and
   a vertical diode formed in a diode well in the semiconductor layer and connected in parallel with said transistor, the diode well having the second conductivity type and being spaced apart from the transistor well,
   wherein said diode has a resistance during breakdown operation of said diode that is smaller than a resistance of said transistor during breakdown operation of said transistor,
   wherein a secondary breakdown current of said diode is larger than a secondary breakdown current of said transistor, and
   wherein said diode has a breakdown voltage that is established at a desired value as a function of a junction depth of said diode, an impurity concentration in said well, a resistivity of said substrate, and a thickness of said substrate.

2. The semiconductor device according to claim 1, wherein the secondary breakdown voltage of said diode is smaller than the secondary breakdown voltage of said transistor.

3. The semiconductor device according to claim 1, wherein the breakdown voltage of said diode is smaller than the breakdown voltage of said transistor.

4. The semiconductor device according to claim 3, wherein the secondary breakdown voltage of said diode is smaller than the secondary breakdown voltage of said transistor.

5. The semiconductor device according to claim 1, wherein the secondary breakdown current of said diode is larger than a surge current flowing to said diode.

6. The semiconductor device according to claim 1, wherein said transistor is a lateral MOSFET and said diode is a Zener diode.

7. A semiconductor device, comprising:
   a semiconductor layer having a first conductivity type:
   a transistor formed in a transistor well in the semiconductor layer, the transistor having a second conductivity type;
   an input terminal;
   an output terminal;
   a voltage source terminal; and
   a surge absorption element that protects the transistor and that is formed in a surge absorption well in a semiconductor layer at a position spaced apart from the transistor well, the surge absorption well having the second conductivity type, the surge absorption element being provided in a circuit location between the input terminal and voltage source terminal, a circuit location between the output terminal and voltage source terminal, or a circuit location between the voltage source terminal and ground;

wherein the surge absorption element and the transistor satisfy all of the following relationships:

the surge absorption element has a resistance during breakdown operation of the surge absorption element that is smaller than a resistance of the transistor during breakdown operation of the transistor, a secondary breakdown current of the surge absorption element is larger than a secondary breakdown current of the transistor, the secondary breakdown voltage of the surge absorption element is smaller than the secondary breakdown voltage of the transistor, the breakdown voltage of the surge absorption element is smaller than the breakdown voltage of the transistor, and the secondary breakdown current of the surge absorption element is larger than a surge current flowing to the surge absorption element.

8. The semiconductor device of claim 1, wherein said substrate has a resistivity ranging from about 0.3 Ωcm to about 10 Ωcm at a location where said diode and said transistor are fabricated.

9. The semiconductor device of claim 1, wherein said diode occupies in an area on said substrate that is not substantially larger than is necessary in order for the resistance of said diode during breakdown operation of said diode to be smaller than the resistance of the transistor during breakdown operation of the transistor, and for the secondary breakdown current of said diode to be larger than the secondary breakdown current of said transistor.

10. The semiconductor device of claim 7, wherein the transistor and the surge absorption element are fabricated on a substrate, and wherein said substrate has a resistivity ranging from about 0.3 Ωcm to about 10 Ωcm at a location where said surge absorption element and said transistor are fabricated.

11. The semiconductor device of claim 7, wherein the transistor and the surge absorption element are fabricated on a substrate, and wherein said surge absorption element occupies in an area on said substrate that is not substantially larger than is necessary in order for said surge absorption element to fulfill said relationships.

12. The semiconductor device of claim 7, wherein the surge absorption element is a vertical diode that is formed in a diode well, said diode having a breakdown voltage that is established at a desired value as a function of a junction depth of the diode, an impurity concentration in the well, a resistivity of a substrate on which the diode and the transistor are fabricated, and the thickness of the substrate.

* * * * *